(12) United States Patent
Wu et al.

(10) Patent No.: US 11,309,229 B2
(45) Date of Patent: Apr. 19, 2022

(54) COATING COMPOSITION(S)

(71) Applicant: HEWLETT-PACKARD DEVELOPMENT COMPANY, L.P., Spring, TX (US)

(72) Inventors: Kuan-Ting Wu, Taipei (TW); Jamal Wakil, Spring, TX (US); Davis Castillo, Spring, TX (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 215 days.

(21) Appl. No.: 16/617,956

(22) PCT Filed: Jul. 13, 2017

(86) PCT No.: PCT/US2017/041857
§ 371 (c)(1),
(2) Date: Nov. 27, 2019

(87) PCT Pub. No.: WO2019/013793
PCT Pub. Date: Jan. 17, 2019

(65) Prior Publication Data
US 2020/0235034 A1    Jul. 23, 2020

(51) Int. Cl.
| | | |
|---|---|---|
| H01L 23/373 | (2006.01) | |
| C09D 7/61 | (2018.01) | |
| C09D 7/20 | (2018.01) | |
| C09D 133/08 | (2006.01) | |
| C09D 167/00 | (2006.01) | |
| C09D 169/00 | (2006.01) | |
| C09D 175/04 | (2006.01) | |
| C08K 3/04 | (2006.01) | |
| C08K 3/08 | (2006.01) | |

(52) U.S. Cl.
CPC ............ *H01L 23/3737* (2013.01); *C09D 7/20* (2018.01); *C09D 7/61* (2018.01); *C09D 133/08* (2013.01); *C09D 167/00* (2013.01); *C09D 169/00* (2013.01); *C09D 175/04* (2013.01); *C08K 3/041* (2017.05); *C08K 3/042* (2017.05); *C08K 2003/085* (2013.01); *C08K 2003/0812* (2013.01)

(58) Field of Classification Search
None
See application file for complete search history.

(56) References Cited

U.S. PATENT DOCUMENTS

| | | | |
|---|---|---|---|
| 9,360,905 B2 | 6/2016 | Zhamu et al. | |
| 9,363,932 B2 | 6/2016 | Wang et al. | |
| 2014/0240921 A1 | 8/2014 | Sultenfuss et al. | |
| 2014/0345843 A1 | 11/2014 | Kirkor et al. | |
| 2015/0267908 A1 | 9/2015 | Smith et al. | |
| 2017/0017279 A1 | 1/2017 | Saeidi et al. | |
| 2017/0060177 A1 | 3/2017 | Rahim et al. | |
| 2019/0010340 A1* | 1/2019 | Yoon ........................ C09D 7/62 |

FOREIGN PATENT DOCUMENTS

| | | |
|---|---|---|
| CN | 102850911 A | 1/2013 |
| CN | 104582428 A | 4/2015 |
| CN | 105440832 | 3/2016 |
| CN | 105514059 | 4/2016 |
| CN | 205420261 | 8/2016 |
| EP | 2865729 | 4/2015 |
| JP | 62216979 A | 9/1987 |
| JP | 02207555 B2 | 8/1990 |
| JP | 2005-322956 A | 11/2005 |
| JP | 2014-531382 A | 11/2014 |
| JP | 2014-236007 A | 12/2014 |
| JP | 2016-139492 A | 8/2016 |
| TW | 201604248 B | 2/2016 |
| TW | 588219 | 6/2017 |
| WO | WO-2013066269 | 5/2013 |
| WO | WO-2017018999 | 2/2017 |
| WO | WO-2017018999 A1 | 2/2017 |
| WO | 2017/036055 A1 | 3/2017 |

OTHER PUBLICATIONS

Li Hongqiang, "Principle, Technology and Application of Adhesive", South China University of Technology Press, Jan. 31, 2014, 3 pages.

SMT, "Electrolube Showcases New Thermal Products at Nepcon", Aug. 14, 2012, 4 pages.

Zhou Wenying et al.,"Thermally Conductive Polymer Materials",National Defense Industry Press, 2014, 3 pages.

\* cited by examiner

*Primary Examiner* — Robert T Butcher
(74) *Attorney, Agent, or Firm* — Brooks, Cameron and Huebsch PLLC

(57) ABSTRACT

Described herein in some examples is a heat dissipation coating composition for an electronic device, which can comprise: a transparent coating layer deposited on a surface of the electronic device, wherein the coating layer comprises: a heat absorber selected from the group consisting of silica aerogel, carbon nanotubes, carbon nanotube aerogel, graphene, graphene aerogel, and combinations thereof, a transparent resin selected from the group consisting of a polyacrylic resin, a polycarbonate resin, a cyclic olefin resin, an epoxy resin, a urethane resin, a silicone resin, a cyanoacrylate resin, a polyester resin, and combinations thereof, and a solvent; and a heat spreader layer deposited at least partially on top of the transparent coating layer or deposited on the surface of the electronic device adjacent to the transparent coating layer, wherein the heat spreader layer comprises: metallic or non-metallic particles selected from the group consisting of copper, aluminum, graphite, carbon nanotube, graphene on a metal, graphene, and combinations thereof.

10 Claims, 8 Drawing Sheets

COATING COMPOSITION(S)

BACKGROUND

Electronic devices such as desktop computers, laptop computers, mobile phones, handheld devices, printing devices, and other electronic devices tend to heat during use.

BRIEF DESCRIPTION OF THE DRAWINGS

Features of examples of the present disclosure will become apparent by reference to the following detailed description and drawings, in which like reference numerals correspond to similar, though perhaps not identical, components. For the sake of brevity, reference numerals or features having a previously described function may or may not be described in connection with other drawings in which they appear.

DETAILED DESCRIPTION

Figure 1:
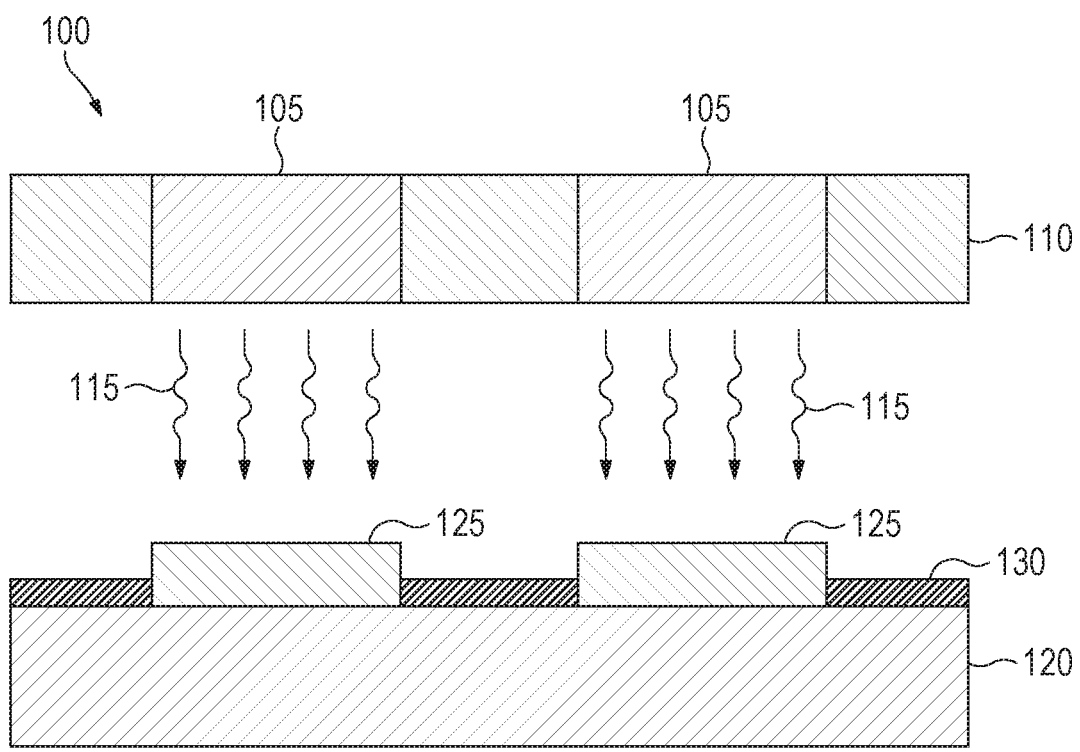
FIG. 1 is a sectional view of an electronic device substrate coated with a heat dissipation coating composition according to an example.

Most electronic device(s) such as desktop computers, laptop computers, mobile phones, handheld devices, printing devices, and other electronic devices tend to generate heat during normal use. This generation of heat can be become excessive and as a result damaging to the device due to many different reasons including dust inside the electronic device, a new component such as a hard drive added to the electronic device (the extra component can cause the power supply to work harder and generate extra heat), over time some cooling fans might slow down and wear out causing a build-up of heat, and/or high ambient room temperature.

A common cause of overheating is the accumulation of dust inside the electronic device. The electrical components in the device can generate heat and any fans inside the device can help move the air to keep the components cooled to normal operating temperatures. Inadequate cooling can cause excess heat to build up inside the device which can damage components.

Heat buildup can cause problems for any electronic device. Generally, when temperatures inside the device rises above about 35° C., the risk of damaging important internal components can increases greatly.

Accordingly, a need exists for a heat dissipation coating composition for electronic devices that can absorb/spread heat such that overheating of electronic devices is reduced or eliminated.

"Electronic device(s)" as described herein is/are not limited to and can include desktop computers, laptop computers, mobile phones, handheld devices, and printing devices.

As used herein, "(s)" at the end of some terms indicates that those terms/phrases may be singular in some examples or plural in some examples. It is to be understood that the terms without "(s)" may be also be used singularly or plurally in many examples.

"Heat Dissipation," as used herein, refers to a composition that can absorb and/or distribute heat to thereby reduce heat emanating from any electronic device hot spots.

In some examples, described herein is a heat dissipation coating composition for an electronic device comprising: a transparent coating layer deposited on a surface of the electronic device, wherein the coating layer comprises: a heat absorber selected from the group consisting of silica aerogel, carbon nanotubes, carbon nanotube aerogel, graphene, graphene aerogel, and combinations thereof, a transparent resin selected from the group consisting of a polyacrylic resin, a polycarbonate resin, a cyclic olefin resin, an epoxy resin, a urethane resin, a silicone resin, a cyanoacrylate resin, a polyester resin, and combinations thereof, and a solvent; and a heat spreader layer deposited at least partially on top of the transparent coating layer or deposited on the surface of the electronic device adjacent to the transparent coating layer, wherein the heat spreader layer comprises: metallic or non-metallic particles selected from the group consisting of copper, aluminum, graphite, carbon nanotube, graphene on a metal, graphene, and combinations thereof.

In some examples, the transparent coating layer fully coats the surface of the electronic device.

In some examples, the transparent coating layer fully coating the surface of the electronic device has a thickness of about 1 μm to about 100 μm, or from about 5 μm to about 75 μm, or from about 10 μm to about 50 μm.

In some examples, the heat absorber is present in the transparent coating layer in an amount of from about 10 wt % to about 70 wt % based on the total weight of the transparent coating layer, or from about 15 wt % to about 60 wt % based on the total weight of the transparent coating layer, or from about 20 wt % to about 50 wt % based on the total weight of the transparent coating layer, or less than about 70 wt % based on the total weight of the transparent coating layer, or less than about 60 wt % based on the total weight of the transparent coating layer, or less than about 50 wt % based on the total weight of the transparent coating layer, or less than about 40 wt % based on the total weight of the transparent coating layer, or at least about 10 wt % based on the total weight of the transparent coating layer, or at least about 20 wt % based on the total weight of the transparent coating layer, or at least about 30 wt % based on the total weight of the transparent coating layer, or at least about 40 wt % based on the total weight of the transparent coating layer, or at least about 50 wt % based on the total weight of the transparent coating layer.

In some examples, the transparent resin is present in the transparent coating layer in an amount of from about 5 wt % to about 50 wt % based on the total weight of the transparent coating layer, or from about 10 wt % to about 45 wt % based on the total weight of the transparent coating layer, from about 15 wt % to about 40 wt % based on the total weight of the transparent coating layer, or from about 20 wt % to about 35 wt % based on the total weight of the transparent coating layer, or less than about 50 wt % based on the total weight of the transparent coating layer, or less than about 40 wt % based on the total weight of the transparent coating layer, or less than about 30 wt % based on the total weight of the transparent coating layer, or less than about 20 wt % based on the total weight of the transparent coating layer, or at least about 5 wt % based on the total weight of the transparent coating layer, or at least about 10 wt % based on the total weight of the transparent coating layer, or at least about 15 wt % based on the total weight of the transparent coating layer, or at least about 20 wt % based on the total weight of the transparent coating layer, or at least about 25 wt % based on the total weight of the transparent coating layer, or at least about 30 wt % based on the total weight of the transparent coating layer, or at least about 35 wt % based on the total weight of the transparent coating layer, or at least about 40 wt % based on the total weight of the transparent coating layer, or at least about 45 wt % based on the total weight of the transparent coating layer.

In some examples, the solvent is selected from the group consisting of ketone-based solvents, ester-based solvents, alcohol-based solvents, amide-based solvents, ether-based solvents, a hydrocarbon-based solvents, and combinations thereof.

In some examples, the heat spreader layer is deposited to coat 50% or less of the top of the transparent coating layer.

In some examples, the heat spreader layer is deposited to coat at least 50% of the top of the transparent coating layer.

In some examples, the heat spreader layer is deposited on the surface of the electronic device adjacent to the transparent coating layer spreader layer to coat 50% or less of the surface of the electronic device.

In some examples, the heat spreader layer has a thickness of about 0.01 mm to about 0.5 mm, or from about 0.02 mm to about 0.4 mm, or from about 0.025 mm to about 0.3 mm.

In some examples, described is an electronic device comprising the heat dissipation coating composition described above.

In some examples, described herein is a method of depositing a heat dissipation coating composition on an electronic device comprising: depositing a transparent coating layer on a surface of the electronic device, wherein the coating layer comprises: a heat absorber selected from the group consisting of silica aerogel, carbon nanotubes, carbon nanotube aerogel, graphene, graphene aerogel, and combinations thereof, a transparent resin selected from the group consisting of a polyacrylic resin, a polycarbonate resin, a cyclic olefin resin, an epoxy resin, a urethane resin, a silicone resin, a cyanoacrylate resin, a polyester resin, and combinations thereof, and a solvent; and depositing a heat spreader layer at least partially on top of the transparent coating layer or depositing the heat spreader layer on the surface of the electronic device adjacent to the transparent coating layer, wherein the heat spreader layer comprises: metallic or non-metallic particles selected from the group consisting of copper, aluminum, graphite, graphene on a metal, carbon nanotube, graphene, and combinations thereof.

In some examples, the transparent coating layer fully coating the surface of the electronic device has a thickness of about 1 µm to about 100 µm, or from about 5 µm to about 75 µm, or from about 10 µm to about 50 µm.

In some examples, the heat spreader layer has a thickness of about 0.01 mm to about 0.5 mm, or from about 0.02 mm to about 0.4 mm, or from about 0.025 mm to about 0.3 mm.

In some examples, the heat spreader layer is deposited to coat at least 90% of the top of the transparent coating layer, or to coat at least 91% of the top of the transparent coating layer, or to coat at least 92% of the top of the transparent coating layer, to coat at least 93% of the top of the transparent coating layer, or to coat at least 94% of the top of the transparent coating layer, or to coat at least 95% of the top of the transparent coating layer, or to coat at least 96% of the top of the transparent coating layer, or to coat at least 97% of the top of the transparent coating layer, or to coat at least 98% of the top of the transparent coating layer, or to coat at least 99% of the top of the transparent coating layer, or to coat 100% of the top of the transparent coating layer.

Turning now to the figures:

FIG. 1 is a sectional view of an electronic device substrate coated with a heat dissipation coating composition according to an example. In FIG. 1, an electronic device 100 with hot spots 105 are shown. The hot spots in the electronic device can include but are not limited to the central processing unit (CPU) or an integrated circuit (IC)/printed circuit board (PCB). The heat 115 generated from the hot spots 105 can be absorbed by a transparent coating layer 130 and heat spreader layers 125 both of which are coated on top of a surface 120 of the electronic device. In this example, the surface 120 of the electronic device is on an opposite surface from the surface with the hot spots.

Figure 2:
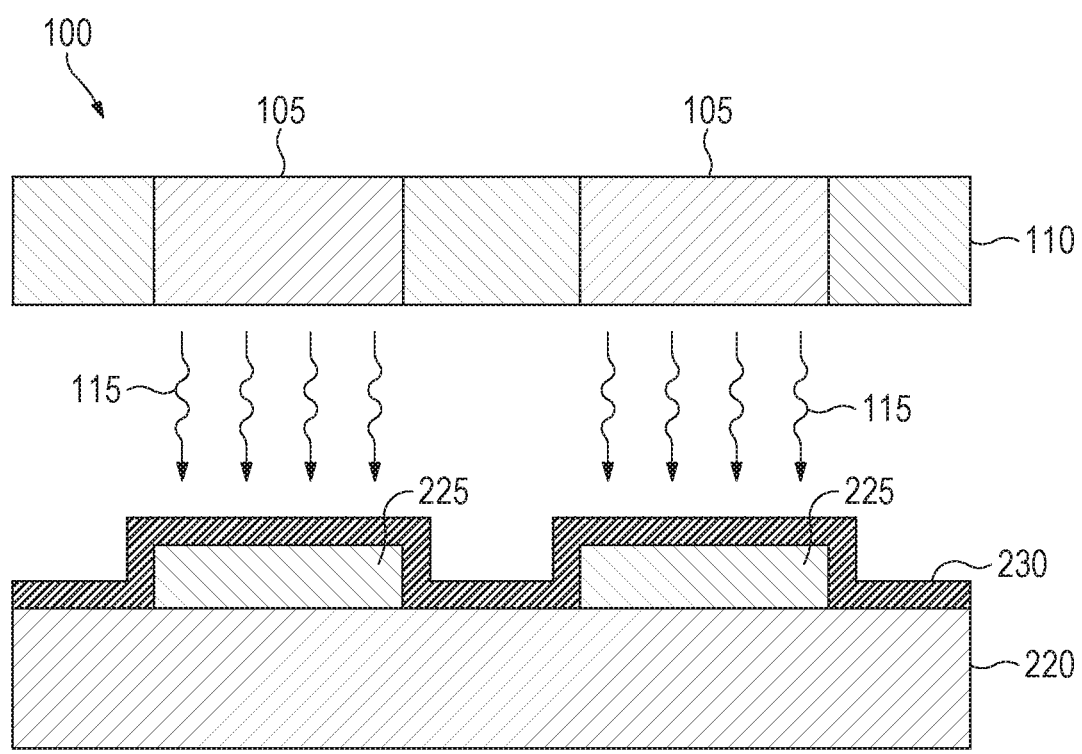
FIG. 2 is a sectional view of an electronic device substrate coated with a heat dissipation coating composition according to another example.

FIG. 2 is a sectional view of an electronic device substrate coated with a heat dissipation coating composition according to another example. In FIG. 2, an electronic device 100 with hot spots 105 are shown. The hot spots in the electronic device can include but are not limited to the CPU or an IC/PCB. The heat 115 generated from the hot spots 105 can be absorbed by a transparent coating layer 230 deposited on top of heat spreader layers 225 both of which are coated on top of a surface 220 of the electronic device. In this example, the surface 220 of the electronic device is on an opposite surface from the surface with the hot spots.

Figure 3:
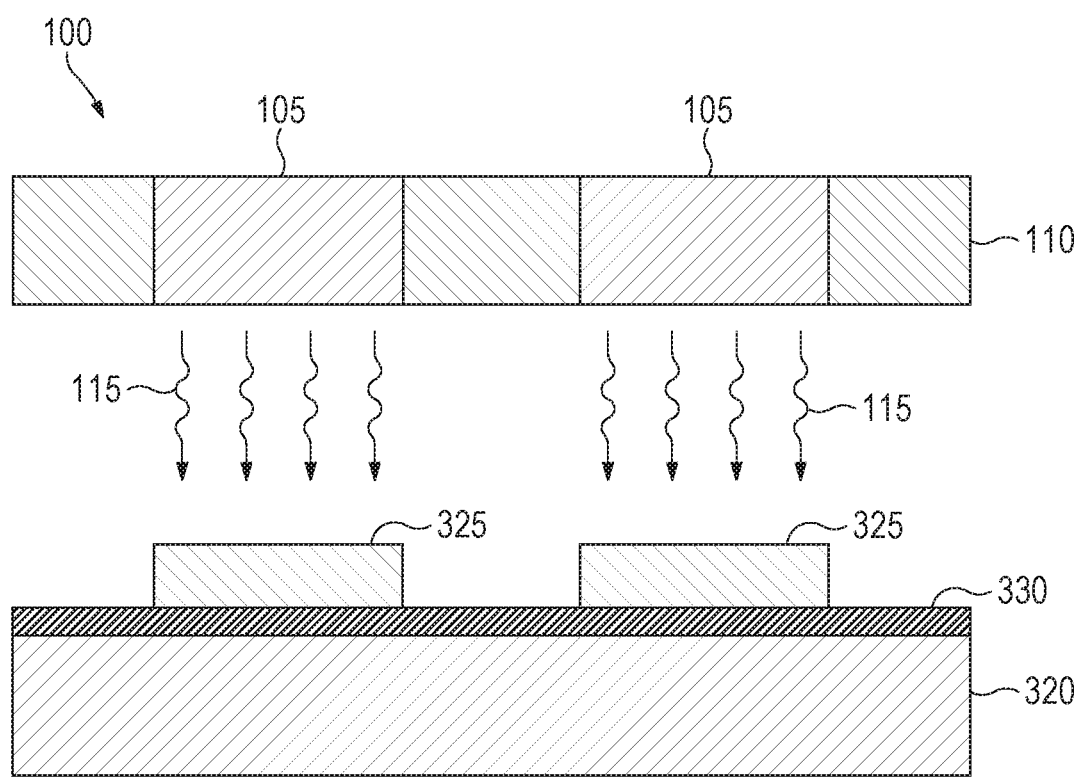
FIG. 3 is a sectional view of an electronic device substrate coated with a heat dissipation coating composition according to another example.

FIG. 3 is a sectional view of an electronic device substrate coated with a heat dissipation coating composition according to another example. In FIG. 3, an electronic device 100 with hot spots 105 are shown. The hot spots in the electronic device can include but are not limited to the CPU or an IC/PCB. The heat 115 generated from the hot spots 105 can be absorbed by a transparent coating layer 330 deposited on top of a surface 320 of the electronic device. Heat spreader layers 325 can be deposited on top of the transparent coating layer 330. In this example, the surface 320 of the electronic device is on an opposite surface from the surface with the hot spots.

Figure 4:
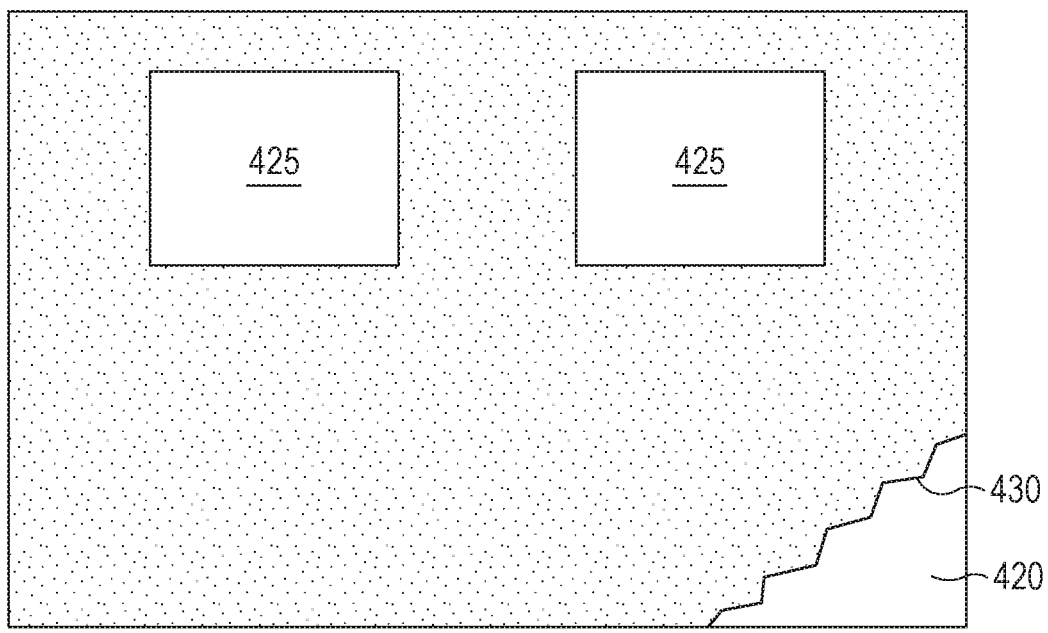
FIG. 4 is a top view of an electronic device substrate coated with a heat dissipation coating composition according to an example.

FIG. 4 is a top view of an electronic device substrate coated with a heat dissipation coating composition according to an example. In FIG. 4, the top view of the examples shown in FIG. 1 and FIG. 2 is shown where the transparent coating layer 430 coats the surface 420 of the electronic device. The heat spreader layers 425 are directly coated on top of the surface 420 of the electronic device.

Figure 5:
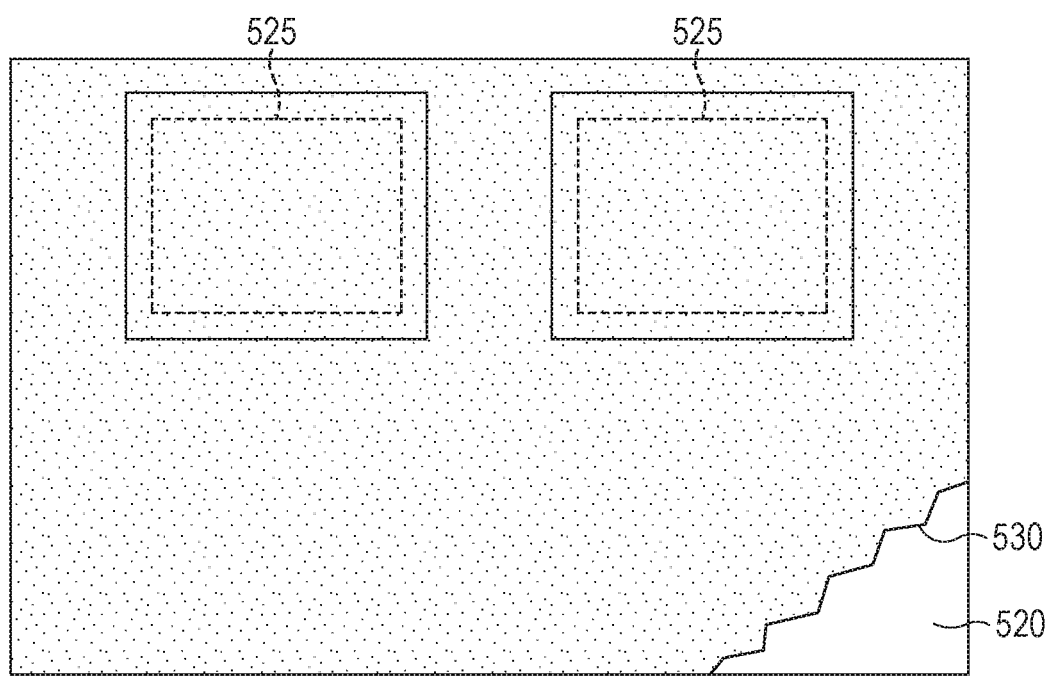
FIG. 5 is a top view of an electronic device substrate coated with a heat dissipation coating composition according to an example.

FIG. 5 is a top view of an electronic device substrate coated with a heat dissipation coating composition according to an example. In FIG. 5, the top view of the example shown in FIG. 3 is shown where the transparent coating layer 530 coats the surface 520 of the electronic device. The heat spreader layers 525 are coated on top of the transparent coating layer 530.

It is to be understood that the configurations described in FIGS. 1-5 can be modified without affecting the functioning of the described heat dissipation coating composition. For example, the hot spots, the transparent coating layer, and the heat spreader layer can be all on the same surface.

Figure 6:
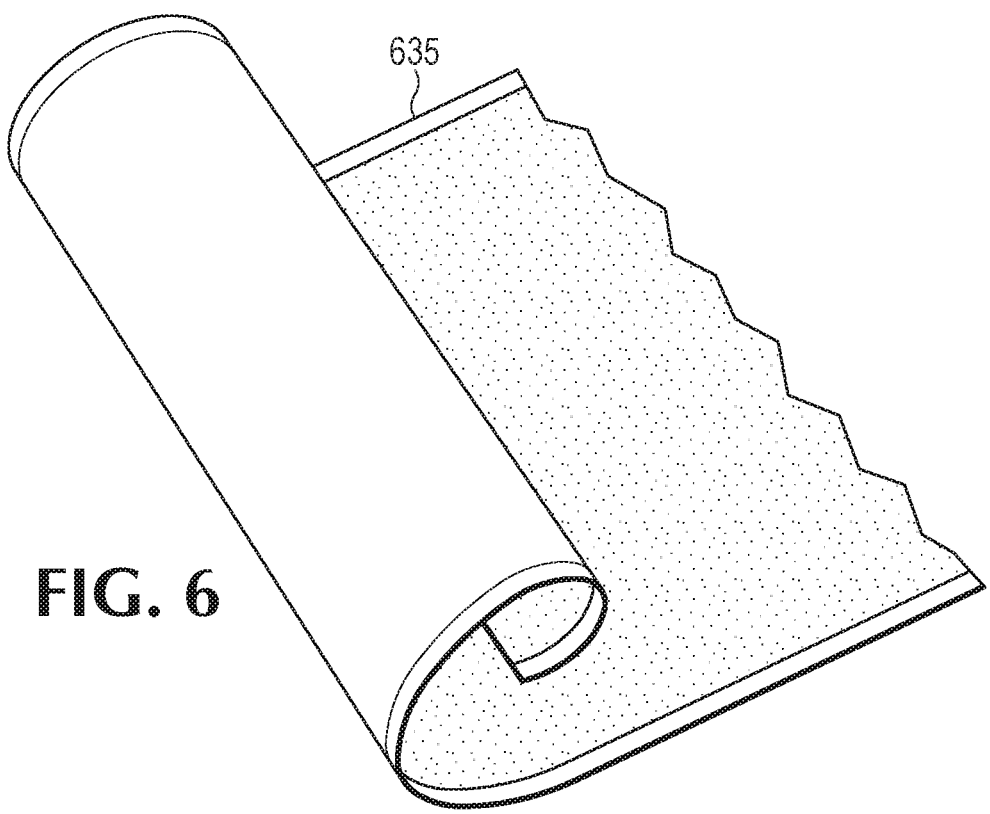
FIG. 6 is a top view of a common synthetic graphite film.

FIG. 6 is a top view of a common synthetic graphite film 635. This commonly used synthetic graphite film has heat dissipation properties but this film is commonly black in color. The use of this layer results in production of an electronic device that has a black surface color. This can be limiting and not a target for many electronic devices. Further, the surface area of the synthetic graphite film is limited to the available area of the electronic device on which the film can be applied. In contrast with this common black colored synthetic graphite film, the heat dissipation coating composition described herein include transparent coating layers, which can allow for wide use across many different applications of electronic devices. Further, the surface area of the transparent coating layer is higher than the common synthetic graphite film due to the presence of silica nanoparticles in aerogel, carbon nanotubes, carbon nanotubes in aerogel, graphene nanoparticles, and combinations thereof.

In some examples, the size of the silica nanoparticles, carbon nanotubes, carbon, and graphene nanoparticles in the transparent coating layer is from about 1 nm to about 800 nm, or from about 10 nm to about 500 nm, or from about 20 nm to about 100 nm, or from about 30 nm to about 80 nm, or at least about 1 nm, or at least about 10 nm, or at least about 50 nm, or at least about 100 nm, or at least about 150 nm, or at least about 200 nm, or at least about 500 nm, or at least about 800 nm, or less than about 1000 nm, or less than about 800 nm, or less than about 500 nm, or less than about 400 nm, or less than about 300 nm, or less than about 200 nm, or less than about 100 nm, or less than about 90 nm, or less than about 80 nm, or less than about 70 nm, or less than about 60 nm, or less than about 50 nm, or less than about 40 nm, or less than about 30 nm, or less than about 20 nm, or less than about 10 nm, or less than about 5 nm, or less than about 3 nm.

In some examples, the amount of the silica nanoparticles, carbon nanotubes, carbon, and graphene nanoparticles in the transparent coating layer is from about 1 wt % to about 70 wt % based on the total weight of the transparent coating layer, or from about 5 wt % to about 60 wt % based on the total weight of the transparent coating layer, or from about 10 wt % to about 50 wt % based on the total weight of the transparent coating layer, or from about 15 wt % to about 45 wt % based on the total weight of the transparent coating layer, or from about 20 wt % to about 40 wt % based on the total weight of the transparent coating layer, or at least about 1 wt % based on the total weight of the transparent coating layer, or at least about 10 wt % based on the total weight of the transparent coating layer, or at least about 20 wt % based on the total weight of the transparent coating layer, or at least about 30 wt % based on the total weight of the transparent coating layer, or at least about 40 wt % based on the total weight of the transparent coating layer, or at least about 50 wt % based on the total weight of the transparent coating layer, or at least about 60 wt % based on the total weight of the transparent coating layer, or at least about 70 wt % based on the total weight of the transparent coating layer, or less than about 85 wt % based on the total weight of the transparent coating layer, or less than about 75 wt % based on the total weight of the transparent coating layer, or less than about 65 wt % based on the total weight of the transparent coating layer, or less than about 55 wt % based on the total weight of the transparent coating layer, or less than about 45 wt % based on the total weight of the transparent coating layer, or less than about 35 wt % based on the total weight of the transparent coating layer, or less than about 25 wt % based on the total weight of the transparent coating layer, or less than about 15 wt % based on the total weight of the transparent coating layer.

In some examples, carbon nanotubes can have high surface areas (e.g., greater than about 1,085 $m^2/g$), which can contribute to thermal radiation absorption/spreading in the transparent coating layer compared to a common synthetic graphite film or other similar common film.

Figure 7:
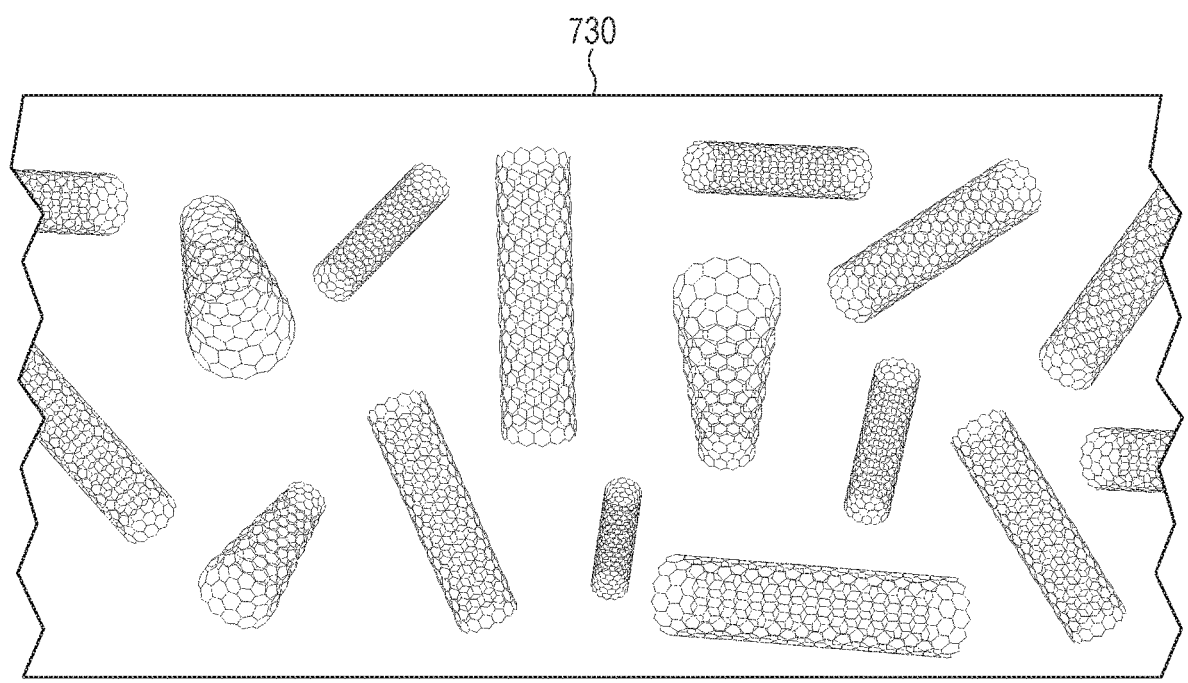
FIG. 7 is a top view of a transparent coating layer in a heat dissipation coating composition according to an example.

FIG. 7 is a top view of a transparent coating layer 730 in a heat dissipation coating composition according to an example. The transparent coating layer 730 includes carbon nanotubes of various shapes.

Figure 8:
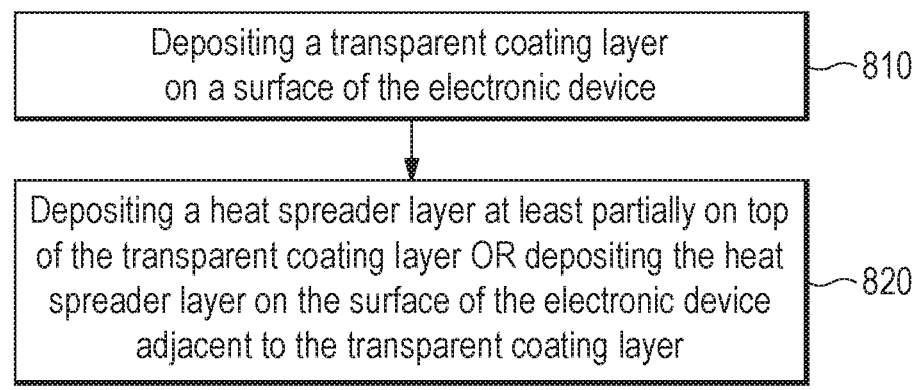
FIG. 8 is a flow diagram of a method of depositing a heat dissipation coating composition on an electronic device according to an example.

FIG. 8 is a flow diagram of a method of depositing a heat dissipation coating composition on an electronic device according to an example. The method can include depositing a transparent coating layer on a surface of the electronic device 810 and depositing a heat spreader layer at least partially on top of the transparent coating layer or depositing the heat spreader layer on the surface of the electronic device adjacent to the transparent coating layer 820.

In some examples, described herein is a heat dissipation coating composition for an electronic device comprising: a transparent coating layer deposited on a surface of the electronic device, wherein the coating layer comprises: a heat absorber selected from the group consisting of silica aerogel, carbon nanotubes, carbon nanotube aerogel, graphene, graphene aerogel, and combinations thereof, a transparent resin selected from the group consisting of a polyacrylic resin, a polycarbonate resin, a cyclic olefin resin, an epoxy resin, a urethane resin, a silicone resin, a cyanoacrylate resin, a polyester resin, and combinations thereof, and a solvent; and a heat spreader layer deposited at least partially on top of the transparent coating layer or deposited on the surface of the electronic device adjacent to the transparent coating layer, wherein the heat spreader layer comprises: metallic or non-metallic particles selected from the group consisting of copper, aluminum, graphite, graphene on a metal, carbon nanotube, graphene, and combinations thereof.

In some examples, the transparent coating layer can comprise: a heat absorber selected from the group consisting of silica aerogel, carbon nanotubes, carbon nanotube aerogel, graphene, graphene aerogel, and combinations thereof; a transparent resin selected from the group consisting of a polyacrylic resin, a polycarbonate resin, a cyclic olefin resin, an epoxy resin, a urethane resin, a silicone resin, a cyanoacrylate resin, a polyester resin, and combinations thereof; and a solvent.

In some examples, the thermal radiation coefficient of the transparent coating layer is in the range of 0.9-0.98.

In some examples, the heat absorber is present in the transparent coating layer in an amount of from about 10 wt % to about 70 wt % based on the total weight of the transparent coating layer, or from about 15 wt % to about 60 wt % based on the total weight of the transparent coating layer, or from about 20 wt % to about 50 wt % based on the total weight of the transparent coating layer, or less than about 70 wt % based on the total weight of the transparent coating layer, or less than about 60 wt % based on the total weight of the transparent coating layer, or less than about 50 wt % based on the total weight of the transparent coating layer, or less than about 40 wt % based on the total weight of the transparent coating layer, or at least about 10 wt % based on the total weight of the transparent coating layer, or at least about 20 wt % based on the total weight of the transparent coating layer, or at least about 30 wt % based on the total weight of the transparent coating layer, or at least about 40 wt % based on the total weight of the transparent coating layer, or at least about 50 wt % based on the total weight of the transparent coating layer.

In some examples, the transparent resin is present in the transparent coating layer in an amount of from about 5 wt % to about 50 wt % based on the total weight of the transparent coating layer, or from about 10 wt % to about 45 wt % based on the total weight of the transparent coating layer, from about 15 wt % to about 40 wt % based on the total weight of the transparent coating layer, or from about 20 wt % to about 35 wt % based on the total weight of the transparent coating layer, or less than about 50 wt % based on the total weight of the transparent coating layer, or less than about 40 wt % based on the total weight of the transparent coating layer, or less than about 30 wt % based on the total weight of the transparent coating layer, or less than about 20 wt % based on the total weight of the transparent coating layer, or at least about 5 wt % based on the total weight of the transparent coating layer, or at least about 10 wt % based on the total weight of the transparent coating layer, or at least about 15 wt % based on the total weight of the transparent coating layer, or at least about 20 wt % based on the total weight of the transparent coating layer, or at least about 25 wt % based on the total weight of the transparent coating layer, or at least about 30 wt % based on the total weight of the transparent coating layer, or at least about 35 wt % based on the total weight of the transparent coating layer, or at least about 40 wt % based on the total weight of the transparent coating layer, or at least about 45 wt % based on the total weight of the transparent coating layer.

In some examples, the solvent is selected from the group consisting of ketone-based solvents, ester-based solvents, alcohol-based solvents, amide-based solvents, ether-based solvents, a hydrocarbon-based solvents, and combinations thereof. The solvent is present in the transparent coating layer in an amount of from about 10 wt % to about 70 wt % based on the total weight of the transparent coating layer, or from about 20 wt % to about 60 wt % based on the total weight of the transparent coating layer, or from about 30 wt % to about 50 wt % based on the total weight of the transparent coating layer, or less than about 70 wt % based on the total weight of the transparent coating layer, or less than about 60 wt % based on the total weight of the transparent coating layer, or less than about 50 wt % based on the total weight of the transparent coating layer, or less than about 40 wt % based on the total weight of the transparent coating layer, or less than about 30 wt % based on the total weight of the transparent coating layer, or less than about 20 wt % based on the total weight of the transparent coating layer, or at least about 10 wt % based on the total weight of the transparent coating layer, or at least about 20 wt % based on the total weight of the transparent coating layer, or at least about 30 wt % based on the total weight of the transparent coating layer, or at least about 40 wt % based on the total weight of the transparent coating layer, or at least about 50 wt % based on the total weight of the transparent coating layer, or at least about 60 wt % based on the total weight of the transparent coating layer, or at least about 70 wt % based on the total weight of the transparent coating layer.

In some examples, the transparent coating layer can include plasticizer(s), flow promoter(s), surfactant(s), release agent(s), flatting agent(s), coloring agent(s), wetting agent(s), wax ingredient(s), silicone based polymer ingredient(s) (e.g., polydimethylsiloxane (PDMS)), matting agent(s), co-solvent(s), or combinations thereof.

In some examples, the heat spreader layer can comprise: metallic or non-metallic particles selected from the group consisting of copper, aluminum, graphite, graphene on a metal, carbon nanotube, graphene, and combinations thereof.

In some examples, the heat spreader layer can include the transparent resin and the solvent described above for the transparent coating layer.

In some examples, the heat spreader layer can include a non-transparent resin and a solvent selected from the group consisting of ketone-based solvents, ester-based solvents, alcohol-based solvents, amide-based solvents, ether-based solvents, a hydrocarbon-based solvents, and combinations thereof. A non-transparent resin can include but is not limited to polyvinyl acetate or polyvinyl chloride.

The heat spreader layer can further include plasticizer(s), flow promoter(s), surfactant(s), release agent(s), flatting agent(s), coloring agent(s), wetting agent(s), wax ingredient(s), silicone based polymer ingredient(s) (e.g., polydimethylsiloxane (PDMS)), matting agent(s), co-solvent(s), or combinations thereof.

In some examples, described herein is a method of depositing a heat dissipation coating composition on an electronic device comprising: depositing a transparent coating layer on a surface of the electronic device, wherein the coating layer comprises: a heat absorber selected from the group consisting of silica aerogel, carbon nanotubes, carbon nanotube aerogel, graphene, graphene aerogel, and combinations thereof, a transparent resin selected from the group consisting of a polyacrylic resin, a polycarbonate resin, a cyclic olefin resin, an epoxy resin, a urethane resin, a silicone resin, a cyanoacrylate resin, a polyester resin, and combinations thereof, and a solvent; and depositing a heat spreader layer at least partially on top of the transparent coating layer or depositing the heat spreader layer on the surface of the electronic device adjacent to the transparent coating layer, wherein the heat spreader layer comprises: metallic or non-metallic particles selected from the group consisting of copper, aluminum, graphite, graphene on a metal, carbon nanotube, graphene, and combinations thereof.

The methods of depositing the transparent coating layer and the heat spreader layer can include but are not limited to gas phase methods and application methods, and the gas phase methods include physical methods such as a vacuum deposition method, sputtering method and the like, and chemical methods such as a chemical vapor deposition (CVD) method and the like, and the application methods include a roll coat method, gravure coat method, slide coat method, spray method, immersion method and screen printing method, and the like.

Some benefits of the heat dissipation coating composition described herein can include but are not limited to achieving reduced electronic device temperatures, extending lifetime of electronic device components as a result of heat dissipation, increasing thermal radiation dissipation compared to graphite film or graphene film due to high surface area of silica nanoparticles, carbon nanotubes, carbon, and graphene nanoparticles, resolving or reducing electronic device hot spot issues, reducing the risk of battery explosion due to electronic device overheating, preventing or reducing user injury due to hot spots, achieving reduction or elimination of hot spots thereby allowing fan-less electronic devices, improving information loading speed and power efficiency, applying the heat dissipation coating composition allows heat dissipation in irregularly shaped electronic device, and combinations thereof.

Unless otherwise stated, any feature described hereinabove can be combined with any example or any other feature described herein.

In describing and claiming the examples disclosed herein, the singular forms "a," "an," and "the" include plural referents unless the context clearly dictates otherwise.

It is to be understood that concentrations, amounts, and other numerical data may be expressed or presented herein in range formats. It is to be understood that such range formats are used merely for convenience and brevity and thus should be interpreted flexibly to include not just the numerical values explicitly recited as the end points of the range, but also to include all the individual numerical values or sub-ranges encompassed within that range as if each numerical value and sub-range is explicitly recited. As an illustration, a numerical range of "about 1 wt % to about 5 wt %" should be interpreted to include not just the explicitly recited values of about 1 wt % to about 5 wt %, but also include individual values and subranges within the indicated range. Thus, included in this numerical range are individual values such as 2, 3.5, and 4 and sub-ranges such as from 1-3, from 2-4, and from 3-5, etc. This same applies to ranges reciting a single numerical value.

Reference throughout the specification to "one example," "some examples," "another example," "an example," and so forth, means that a particular element (e.g., feature, structure, and/or characteristic) described in connection with the example is included in at least one example described herein, and may or may not be present in other examples. In addition, it is to be understood that the described elements for any example may be combined in any suitable manner in the various examples unless the context clearly dictates otherwise.

Unless otherwise stated, references herein to "wt %" of a component are to the weight of that component as a percentage of the whole composition comprising that component. For example, references herein to "wt %" of, for example, a solid material such as polyurethane(s) or colorant(s) dispersed in a liquid composition are to the weight percentage of those solids in the composition, and not to the amount of that solid as a percentage of the total non-volatile solids of the composition.

If a standard test is mentioned herein, unless otherwise stated, the version of the test to be referred to is the most recent at the time of filing this patent application.

All amounts disclosed herein and in the examples below are in wt % unless indicated otherwise.

While several examples have been described in detail, it is to be understood that the disclosed examples may be modified. Therefore, the foregoing description is to be considered non-limiting.

What is claimed is:

1. An electronic device comprising a heat dissipation coating composition, wherein the heat dissipation coating composition comprises:
   a transparent coating layer deposited on a surface of the electronic device, wherein the transparent coating layer comprises:
      a heat absorber selected from the group consisting of silica aerogel, carbon nanotube aerogel, graphene aerogel, and combinations thereof,
      a transparent resin selected from the group consisting of a polyacrylic resin, a polycarbonate resin, a cyclic olefin resin, an epoxy resin, a urethane resin, a silicone resin, a cyanoacrylate resin, a polyester resin, and combinations thereof, and
      a solvent; and
   a heat spreader layer deposited at least partially on top of the transparent coating layer or deposited on the surface of the electronic device adjacent to the transparent coating layer, wherein the heat spreader layer comprises:
      metallic or non-metallic particles selected from the group consisting of copper, aluminum, graphite, carbon nanotube, graphene on a metal, graphene, and combinations thereof,
      wherein the heat spreader layer is deposited to coat 50% or less of the top of the transparent coating layer; or
      wherein the heat spreader layer is deposited on the surface of the electronic device adjacent to the transparent coating layer spreader layer to coat 50% or less of the surface of the electronic device.

2. The electronic device of claim 1, wherein the transparent coating layer fully coats the surface of the electronic device.

3. The electronic device of claim 2, wherein the transparent coating layer fully coating the surface of the electronic device has a thickness of about 1 μm to about 100 μm.

4. The electronic device of claim 1, wherein the heat absorber is present in the transparent coating layer in an amount of from about 10 wt % to about 70 wt % based on the total weight of the transparent coating layer.

5. The electronic device of claim 1, wherein the transparent resin is present in the transparent coating layer in an amount of from about 5 wt % to about 50 wt % based on the total weight of the transparent coating layer.

6. The electronic device of claim 1, wherein the solvent is selected from the group consisting of ketone-based solvents, ester-based solvents, alcohol-based solvents, amide-based solvents, ether-based solvents, a hydrocarbon-based solvents, and combinations thereof.

7. The electronic device of claim 1, wherein the heat spreader layer has a thickness of about 0.01 mm to about 0.5 mm.

8. A method of depositing a heat dissipation coating composition on an electronic device comprising:
   depositing a transparent coating layer on a surface of the electronic device, wherein the coating layer comprises:
      a heat absorber selected from the group consisting of silica aerogel, carbon nanotube aerogel, graphene aerogel, and combinations thereof,
      a transparent resin selected from the group consisting of a polyacrylic resin, a polycarbonate resin, a cyclic olefin resin, an epoxy resin, a urethane resin, a silicone resin, a cyanoacrylate resin, a polyester resin, and combinations thereof, and
      a solvent; and
   depositing a heat spreader layer at least partially on top of the transparent coating layer or depositing the heat spreader layer on the surface of the electronic device adjacent to the transparent coating layer, wherein the heat spreader layer comprises:
      metallic or non-metallic particles selected from the group consisting of copper, aluminum, graphite, carbon nanotube, graphene on a metal, graphene, and combinations thereof,
      wherein the heat spreader layer is deposited to coat 50% or less of the top of the transparent coating layer; or
      wherein the heat spreader layer is deposited on the surface of the electronic device adjacent to the transparent coating layer spreader layer to coat 50% or less of the surface of the electronic device.

9. The method of depositing a heat dissipation coating composition of claim 8, wherein the transparent coating layer fully coating the surface of the electronic device has a thickness of about 1 μm to about 100 μm.

10. The method of depositing a heat dissipation coating composition of claim 8, wherein the heat spreader layer has a thickness of about 0.01 mm to about 0.5 mm.

\* \* \* \* \*